United States Patent [19]

Doan et al.

[11] Patent Number: 5,278,100

[45] Date of Patent: * Jan. 11, 1994

[54] CHEMICAL VAPOR DEPOSITION TECHNIQUE FOR DEPOSITING TITANIUM SILICIDE ON SEMICONDUCTOR WAFERS

[75] Inventors: Trung T. Doan; Gurtej S. Sandhu, both of Boise, Id.

[73] Assignee: Micron Technology, Inc., Boise, Id.

[*] Notice: The portion of the term of this patent subsequent to Oct. 12, 2010 has been disclaimed.

[21] Appl. No.: 789,585

[22] Filed: Nov. 8, 1991

[51] Int. Cl.$^5$ ............................................. H01L 21/441
[52] U.S. Cl. ................................ 437/200; 437/245; 148/DIG. 147
[58] Field of Search ......... 148/DIG.147; 437/200, 245

[56] References Cited

U.S. PATENT DOCUMENTS 4,668,530  5/1987  Reif et al. .................... 437/200 X
4,804,636  2/1989  Groover, III et al. ........ 437/200 X

FOREIGN PATENT DOCUMENTS 0377137  7/1990  European Pat. Off. ............ 437/200

OTHER PUBLICATIONS

Fix et al., "Titanium Nitride Thin Films: Properties and APCVD Synthesis Using Organometalic Precursors," pp. 357-362 (1990).

Primary Examiner—John S. Maples
Attorney, Agent, or Firm—Wells, St. John, Roberts, Gregory & Matkin

[57] ABSTRACT

A method of providing a conformal layer of TiSi$_x$ atop a semiconductor wafer within a chemical vapor deposition reactor includes the following steps: a) positioning a wafer within the reactor; b) injecting selected quantities of gaseous Ti(NR$_2$)$_4$ precursor, gaseous silane and a carrier gas to within the reactor, where R is selected from the group consisting of H and a carbon containing radical, the quantities of Ti(NR$_2$)$_4$ precursor and silane being provided in a volumetric ratio of Ti(NR$_2$)$_4$ to silane of from 1:300 to 1:10, the quantity of carrier gas being from about 50 sccm to about 2000 sccm and comprising at least one noble gas; and c) maintaining the reactor at a selected pressure and a selected temperature which are effective for reacting the precursor and silane to deposit a film on the wafer, the film comprising a mixture of TiSi$_x$ and TiN, the selected temperature being from about 100° C. to about 500° C., and the selected pressure being from about 150 mTorr to about 100 Torr.

28 Claims, 1 Drawing Sheet

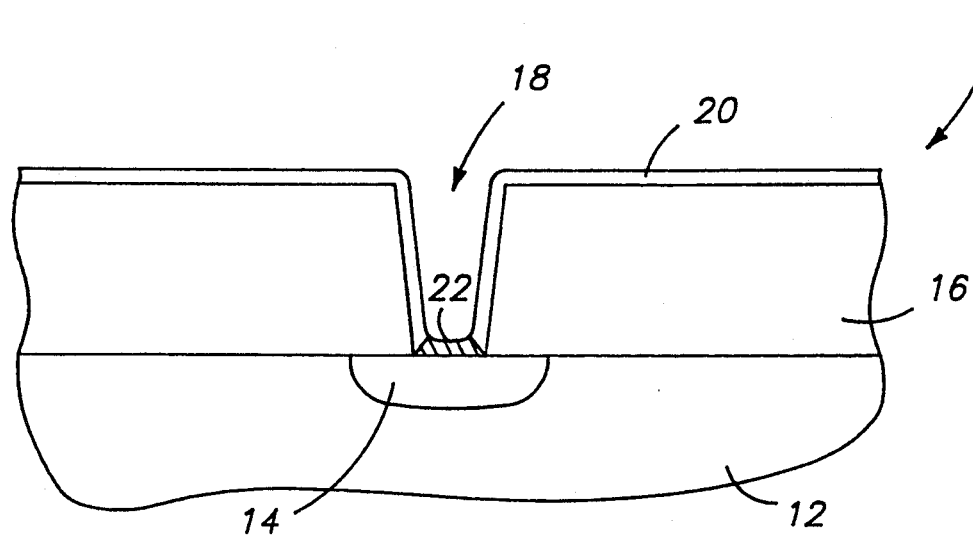
_Fig 1_
PRIOR ART
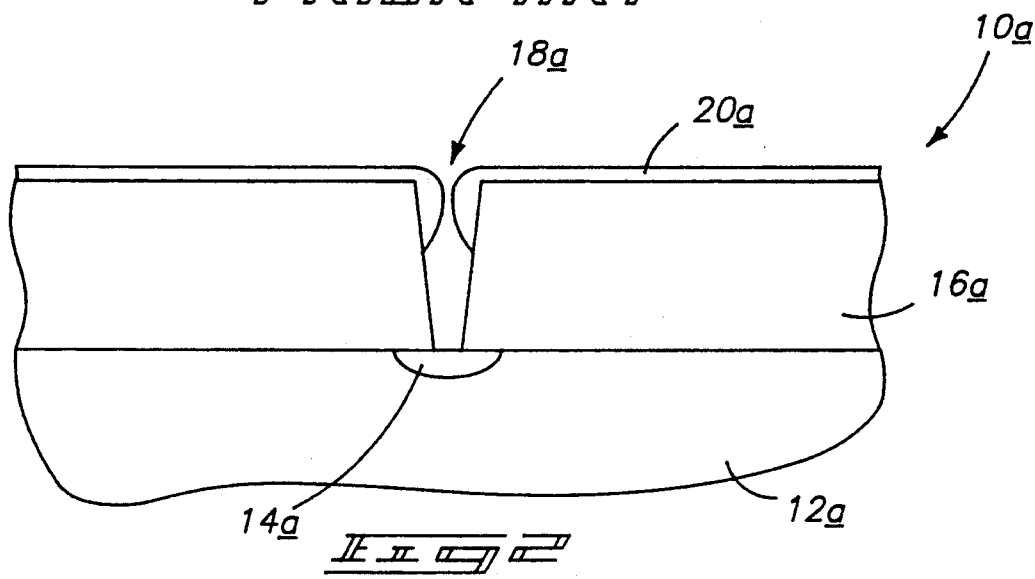
_Fig 2_
PRIOR ART
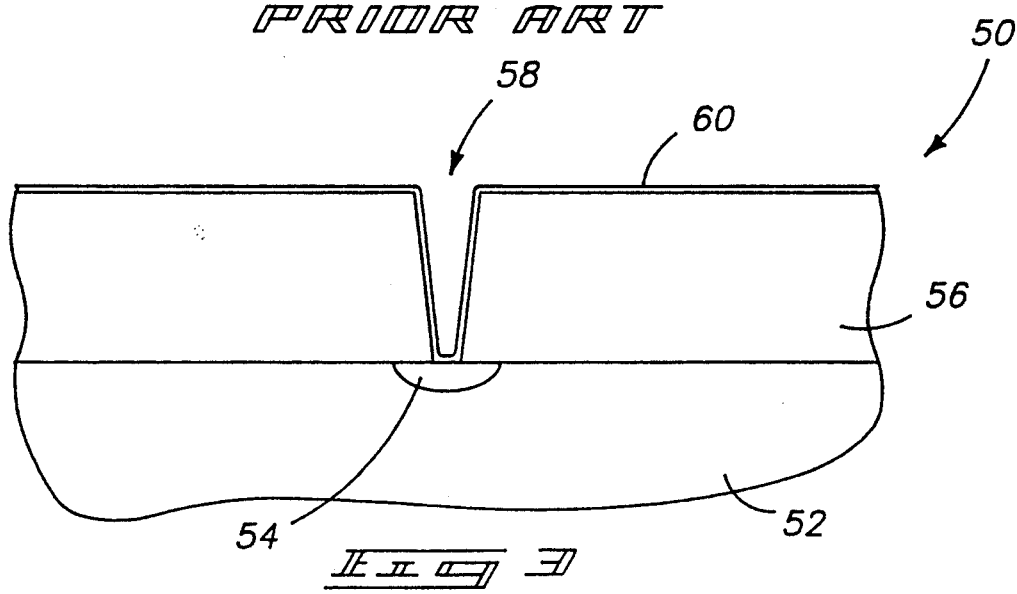
_Fig 3_

CHEMICAL VAPOR DEPOSITION TECHNIQUE FOR DEPOSITING TITANIUM SILICIDE ON SEMICONDUCTOR WAFERS

TECHNICAL FIELD

This invention relates generally to contact technology in semiconductor wafer processing, and more particularly to the providing of silicide layers within contact openings for reducing contact resistance.

BACKGROUND OF THE INVENTION

In the processing of integrated circuits, electrical contact must be made to isolated active-device regions formed within a wafer/substrate. The active-device regions are connected by high electrically conductive paths or lines which are fabricated above an insulator material, which covers the substrate surface. To provide electrical connection between the conductive path and active-device regions, an opening in the insulator is provided to enable the conductive film to contact the desired regions. Such openings are typically referred to as contact openings, or simply "contacts".

As transistor active area dimensions approached one micron in diameter, conventional process parameters resulted in intolerable increased resistance between the active region or area and the conductive layer. A principal way of reducing such contact resistance is by formation of a metal silicide atop the active area prior to application of the conductive film for formation of the conductive runner. One common metal silicide material formed is $TiSi_x$, where x is predominately "2". The $TiSi_x$ material is provided by first applying a thin layer of titanium atop the wafer which contacts the active areas within the contact openings. Thereafter, the wafer is subjected to a high temperature anneal. This causes the titanium to react with the silicon of the active area, thus forming the $TiSi_x$. Such a process is said to be self-aligning, as the $TiSi_x$ is only formed where the titanium metal contacts the silicon active regions. The applied titanium film everywhere else overlies an insulative, and substantially non-reactive $SiO_2$ layer.

Such is illustrated in FIG. 1. Shown is a semiconductor wafer 10 comprised of a bulk substrate 12 having an active area 14 formed therein. An overlying layer 16 of insulating material, predominantly $SiO_2$ in the form of BPSG, has been provided atop substrate 12 and appropriately etched to form a contact opening 18 to active area 14. A thin layer 20 of titanium is applied over insulating layer 16 and contacts active area 14. The high temperature anneal step is conducted in an inert environment, such as argon, to react titanium metal contacting active region 14 into $TiSi_x$, thereby forming the illustrated $TiSi_x$ region 22. The remaining portion of layer 20 not contacting region 14 is substantially nonreactive with its underlying insulating $SiO_2$ layer 16, and thereby remains as elemental titanium metal.

A contact filling material, such as tungsten, is typically applied atop silicide region 22. Tungsten adheres poorly to $TiSi_x$. To overcome this problem, an intervening layer typically of TiN is interposed between silicide region 22 and an overlying tungsten layer. TiN is commonly referred to as a "glue layer" for the metal tungsten layer. Such can be provided by annealing wafer 10 with titanium layer 20 in an atmosphere which is predominantly nitrogen. Under such conditions, the lower portion of layer 20 overlying active region 14 will react with the silicon to form the $TiSi_x$, while the upper portion of layer 20 of the titanium over contact area 14 and the remaining portion of layer 20 over insulating material 16 reacts with the nitrogen of the atmosphere to form TiN.

From this point, the predominate conductive material of the runner to be formed is applied. The silicide region 22 which is formed is highly conductive, and provides less electrical resistance between the runner and active area 14 than were silicide region 22 not present. Formation of such silicides, and titanium silicide in particular, are described in Wolf, et al., "Silicon Processing For The VLSI Era, Vol. 2—Process Integration," pages 143-150.

As device dimensions continue to shrink and the contact openings become deeper and narrower, contact walls become vertical and most of the metal deposition techniques fail to provide the necessary step coverage to create adequate contact with the active area 14. Such is illustrated in FIG. 2. There, active area 14a of substrate 12a is shown significantly smaller than active area 14 in FIG. 1. Correspondingly, a significantly narrower contact opening 18a is provided to active area 14, thereby maximizing circuit density. As is apparent, the ratio of the depth of contact opening 18a relative to its width is greater than the ratio of the depth to the width of contact opening 18 in FIG. 1. Such narrow, high aspect ratio contact openings 18a can result in layer 20a failing to make significant contact with region 14a, as shown. Accordingly, the desired $TiSi_x$ and electrical contact are not formed.

It would be desirable to overcome these drawbacks of the prior art and provide a positive $TiSi_x$ region atop active areas 14 and 14a.

BRIEF DESCRIPTION OF THE DRAWINGS

Preferred embodiments of the invention are described below with reference to the following accompanying drawings.

FIG. 1 is a diagrammatic cross sectional view of a prior art wafer, and is discussed in the "Background" section above.

FIG. 2 is a diagrammatic cross sectional view of an alternate prior art wafer, and is discussed in the "Background" section above.

FIG. 3 is a diagrammatic sectional view of a semiconductor wafer processed in accordance with the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with the invention, disclosed is a chemical vapor deposition (CVD) method of providing a conformal layer of $TiSi_x$ atop a semiconductor wafer within a chemical vapor deposition reactor. The method comprises, a) positioning a wafer within the CVD reactor; b) injecting selected quantities of a gaseous titanium organometallic precursor, gaseous silane ($SiH_4$) and a carrier gas to within the reactor; and c) maintaining the reactor at a selected pressure and a selected temperature which are effective for reacting the precursor and silane to deposit a film on the wafer, where the deposited film comprises $TiSi_x$.

The preferred titanium organometallic precursor consists essentially of Ti(NR$_2$)$_4$, where R is selected from the group consisting of H and a carbon containing radical. Examples include Ti(N(CH$_3$)$_2$)$_4$ and Ti(N(C$_2$H$_5$)$_2$)$_4$. Ti(N(CH$_3$)$_2$)$_4$, commonly referred to as TMAT which is short for tetradimethylamido titanium, is understood to be the most preferred titanium organometallic precursor.

Ti(NR$_2$)$_4$ is an example of an organometallic precursor where titanium is bonded to N. Under such conditions, some of the precursor will be converted to a form of titanium nitride, resulting in the deposited film being a substantially homogenous mixture of titanium nitride and TiSi$_2$ phases. It is expected under such circumstances that the deposited film will comprise approximately 80% TiSi$_x$ and 20% of the titanium nitride. Such a film provides a further distinct advantage in both lowering the contact resistance and also maintaining good diffusion barrier properties, since titanium nitride is a known diffusion barrier material. Accordingly, it is anticipated that a separate barrier layer will not be needed and correspondingly time and materials are saved.

The reaction is shown as follows:

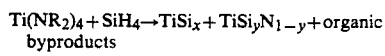

where x is predominantly 2, and y is from 0 to 1. The organic byproducts will be substantially exhausted with the carrier and unreacted gases and are not expected to form any appreciable part of the deposited film.

The quantities of gases fed to the chemical vapor deposition reactor are preferably selected to provide a volumetric ratio of the titanium organometallic precursor to silane of from 1:300 to 1:10, with about 1:80 being most preferred.

A flow of carrier gas is provided to control the gas distribution above the wafer surface to obtain good uniformity of the film deposited across the wafer. The preferred carrier gas is a noble gas, such as helium or argon, with the preferred flow rate of such gas being from about 50 standard cubic centimeters per minute (sccm) to about 2,000 sccm. The most preferred flow rate is believed to be about 150 sccm.

The selected pressure is preferably from about 150 mTorr to about 100 Torr, with 400 mTorr being most preferred. Such conditions are commonly referred to as low pressure chemical vapor deposition (LPCVD). The selected temperature is preferably from about 100° C. to about 500° C., with 400° C. being most preferred.

With a CVD reactor of about 6 liters, the preferred flow rate for the titanium organometallic precursor is from about 2 sccm to about 50 sccm, with a preferred flow rate of the SiH$_4$ being from about 100 sccm to about 2000 sccm. Most preferred is a flow rate of titanium organometallic precursor of about 5 sccm, and a SiH$_4$ flow rate of about 400 sccm. Helium or argon flow rate under such circumstances is preferably 150 sccm, with temperature and pressure being maintained at 400° C. and 400 mTorr, respectively. Under such conditions, the desired film will be deposited at an estimated rate of from about 50 Angstroms to about 100 Angstroms per minute. The preferred thickness of the deposited film is from about 200 Angstroms to about 1000 Angstroms.

FIG. 3 illustrates a wafer 50 processed in accordance with the invention. Wafer 50 includes a bulk substrate 52 having an active area 54 formed therein. An insulating layer 56, predominantly BPSG, has been provided and etched to form a contact opening 58. By the above described technique, a layer 60 of TiSi$_x$ is conformally provided and makes excellent contact with region 54. Where the titanium organometallic precursor is bonded to N, region 60 will as well comprise a TiN type phase.

At this point, it might be desirable to anneal the deposited TiSi$_x$ film to incorporate silicon from active area 54 into the film thereby making a better interconnection and further reducing contact resistance. A preferred environment for such an anneal would consist essentially of a nitrogen containing environment, such as N$_2$ or NH$_3$. Thereafter, the conductive layer can be applied and etched.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A chemical vapor deposition method of providing a conformal layer of TiSi$_x$ atop a semiconductor wafer within a chemical vapor deposition reactor, the method comprising the following steps:
   positioning a wafer within the reactor;
   injecting a gaseous titanium organometallic precursor, gaseous silane and a carrier gas within the reactor; and
   maintaining the reactor at a pressure and a temperature which are effective for reacting the precursor and silane to deposit a film on the wafer, the film comprising TiSi$_x$.

2. The chemical vapor deposition method of claim 1 wherein the gases are injected to provide a volumetric ratio of titanium organometallic precursor to silane of from 1:300 to 1:10.

3. The chemical vapor deposition method of claim 2 wherein the gases are injected to provide a volumetric ratio of titanium organometallic precursor to silane of about 1:80.

4. The chemical vapor deposition method of claim 1 wherein the temperature is from about 100° C. to about 500° C., and the pressure is from about 150 mTorr to about 100 Torr.

5. The chemical vapor deposition method of claim 4 wherein the temperature is about 400° C., and the pressure is about 400 mTorr.

6. The chemical vapor deposition method of claim 1 wherein the carrier gas comprises at least one noble gas, the carrier gas being injected at a rate of from about 50 sccm to about 2000 sccm.

7. The chemical vapor deposition method of claim 1 wherein,
   the gases are injected to provide a volumetric ratio of titanium organometallic precursor to silane of from 1:300 to 1:10, and the carrier gas is provided at a flow rate of from about 50 sccm to about 2000 sccm; and
   the temperature is from about 100° C. to about 500° C., and the pressure is from about 150 mTorr to about 100 Torr.

8. The chemical vapor deposition method of claim 1 wherein gases within the reactor are reacted to deposit a film on the wafer comprising a mixture of $TiSi_x$ and TiN.

9. The chemical vapor deposition method of claim 1 further comprising annealing the deposited $TiSi_x$ film to incorporate silicon from the wafer thereby reducing contact resistance.

10. The chemical vapor deposition method of claim 9 wherein the annealing is conducted in an atmosphere containing predominately $N_2$ or $NH_3$.

11. The chemical vapor deposition method of claim 1 wherein the titanium organometallic precursor consists essentially of $Ti(NR_2)_4$, where R is selected from the group consisting of H and a carbon containing radical.

12. The chemical vapor deposition method of claim 11 wherein the gases are injected to provide a volumetric ratio of titanium organometallic precursor to silane of from 1:300 to 1:10.

13. The chemical vapor deposition method of claim 11 wherein the temperature is about 400° C., and the pressure is about 400 mTorr.

14. The chemical vapor deposition method of claim 11 wherein the gases are injected to provide a volumetric ratio of titanium organometallic precursor to silane of from 1:300 to 1:10, and the temperature is about 400° C. and the pressure is about 400 mTorr.

15. The chemical vapor deposition method of claim 11 wherein the carrier gas comprises at least one noble gas, the carrier gas being injected at a rate of from about 50 sccm to about 2000 sccm.

16. The chemical vapor deposition method of claim 11 wherein the titanium organometallic precursor consists essentially of $Ti(N(C_2H_5)_2)_4$.

17. The chemical vapor deposition method of claim 11 further comprising annealing the deposited $TiSi_x$ film to incorporate silicon from the wafer thereby reducing contact resistance.

18. The chemical vapor deposition method of claim 1 wherein the titanium organometallic precursor consists essentially of $Ti(N(CH_3)_2)_4$.

19. The chemical vapor deposition method of claim 18 wherein the gases are injected to provide a volumetric ratio of titanium organometallic precursor to silane of from 1:300 to 1:10.

20. The chemical vapor deposition method of claim 18 wherein the temperature is about 400° C., and the pressure is about 400 mTorr.

21. The chemical vapor deposition method of claim 18 wherein the gases are injected to provide a volumetric ratio of titanium organometallic precursor to silane of from 1:300 to 1:10, and the temperature is about 400° C. and the pressure is about 400 mTorr.

22. The chemical vapor deposition method of claim 18 wherein the carrier gas comprises at least one noble gas, the carrier gas being injected at a rate of from about 50 sccm to about 2000 sccm.

23. The chemical vapor deposition method of claim 18 further comprising annealing the deposited $TiSi_x$ film to incorporate silicon from the wafer thereby reducing contact resistance.

24. A chemical vapor deposition method of providing a conformal layer of $TiSi_x$ atop a semiconductor wafer within a chemical vapor deposition reactor, the method comprising the following steps:

positioning a wafer within the reactor;

injecting selected quantities of gaseous $Ti(NR_2)_4$ precursor, gaseous silane and a carrier gas to within the reactor, where R is selected from the group consisting of H and a carbon containing radical, the quantities of $Ti(NR_2)_4$ precursor and silane being provided in a volumetric ratio of $Ti(NR_2)_4$ to silane of from 1:300 to 1:10, the quantity of carrier gas being from about 50 sccm to about 2000 sccm and comprising at least one noble gas; and maintaining the reactor at a selected pressure and a selected temperature which are effective for reacting the precursor and silane to deposit a film on the wafer, the film comprising a mixture of $TiSi_x$ and TiN, the selected temperature being from about 100° C. to about 500° C., and the selected pressure being from about 150 mTorr to about 100 Torr.

25. The chemical vapor deposition method of claim 24 wherein the quantities of gases are selected to provide a volumetric ratio of $Ti(NR_2)_4$ precursor to silane of about 1:80, and the quantity of carrier gas is from about 50 sccm to about 2000 sccm.

26. The chemical vapor deposition method of claim 24 further comprising annealing the deposited $TiSi_x$ film to incorporate silicon from the wafer thereby reducing contact resistance.

27. The chemical vapor deposition method of claim 24 wherein the $Ti(NR_2)_4$ precursor consists essentially of $Ti(N(CH_3)_2)_4$.

28. The chemical vapor deposition method of claim 27 wherein the quantities of gases are selected to provide a volumetric ratio of $Ti(NR_2)_4$ precursor to silane of about 1:80, and the quantity of carrier gas is from about 50 sccm to about 2000 sccm.

* * * * *